(12) United States Patent
Li

(10) Patent No.: US 9,947,538 B2
(45) Date of Patent: Apr. 17, 2018

(54) SEMICONDUCTOR DEVICE MANUFACTURING METHOD INCLUDING HEAT TREATMENT

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 15/066,442

(22) Filed: Mar. 10, 2016

(65) Prior Publication Data

US 2017/0092498 A1 Mar. 30, 2017

(51) Int. Cl.
*H01L 21/228* (2006.01)
*H01L 21/8238* (2006.01)
(Continued)

(52) U.S. Cl.
CPC ...... *H01L 21/228* (2013.01); *H01L 21/02123* (2013.01); *H01L 21/2225* (2013.01);
(Continued)

(58) Field of Classification Search
CPC ............... H01L 21/228; H01L 21/2225; H01L 29/66537; H01L 29/66803; H01L 29/0847; H01L 29/1083
See application file for complete search history.

(56) References Cited

U.S. PATENT DOCUMENTS 5,830,539 A * 11/1998 Yan .................. A61L 27/28
427/2.13
9,142,651 B1 * 9/2015 Xie .................. H01L 29/66818
(Continued)

FOREIGN PATENT DOCUMENTS

WO 2014/120392 A1 8/2014
WO 2014/204477 A1 12/2014
WO 2015/047253 A1 4/2015

OTHER PUBLICATIONS

European Search Report, corresponding to EP16190402, dated Jan. 10, 2017, 2 pages.

*Primary Examiner* — Mohsen Ahmadi
(74) *Attorney, Agent, or Firm* — Innovation Counsel LLP

(57) ABSTRACT

A method for manufacturing a semiconductor device may include the following steps: preparing a semiconductor structure that comprises a substrate and a first fin member, wherein the first fin member is connected to the substrate and comprises a first semiconductor portion; providing a first-type dopant member that directly contacts the first semiconductor portion, comprises first-type dopants, and is at least one of liquid and amorphous; and performing heat treatment on at least one of the first-type dopant member and the first semiconductor portion to enable a first portion of the first-type dopants to diffuse through a first side of the first-type dopant member into the first semiconductor portion.

16 Claims, 12 Drawing Sheets

(51) Int. Cl.
*H01L 21/225* (2006.01)
*H01L 29/66* (2006.01)
*H01L 21/22* (2006.01)
*H01L 21/02* (2006.01)
*H01L 29/06* (2006.01)

(52) U.S. Cl.
CPC .. *H01L 21/2254* (2013.01); *H01L 21/823821* (2013.01); *H01L 29/0684* (2013.01); *H01L 29/66537* (2013.01); *H01L 29/66803* (2013.01)

(56) References Cited

U.S. PATENT DOCUMENTS

| | | |
|---|---|---|
| 2007/0108536 A1 | 5/2007 | Ieong et al. |
| 2008/0111185 A1* | 5/2008 | Cheng ............... H01L 29/66795 257/347 |
| 2011/0027957 A1 | 2/2011 | Berry |
| 2011/0309333 A1 | 12/2011 | Cheng et al. |
| 2013/0187207 A1 | 7/2013 | Tang et al. |
| 2013/0233018 A1* | 9/2013 | Takashima ............... C03B 32/00 65/30.13 |
| 2014/0117462 A1* | 5/2014 | Cheng ............... H01L 29/66803 257/410 |
| 2014/0124896 A1 | 5/2014 | Hochstetler et al. |
| 2014/0264492 A1 | 9/2014 | Lee |
| 2014/0377926 A1 | 12/2014 | Kim et al. |
| 2016/0056156 A1* | 2/2016 | Ghani ............. H01L 21/823821 257/401 |
| 2017/0133373 A1* | 5/2017 | Tan .................... H01L 27/0922 |

\* cited by examiner

SEMICONDUCTOR DEVICE MANUFACTURING METHOD INCLUDING HEAT TREATMENT

CROSS-REFERENCE TO RELATED APPLICATION

This application claims priority to and benefit of Chinese Patent Application No. 201510618058.7, filed on 25 Sep. 2015; the Chinese Patent Application is incorporated herein by reference in its entirety.

BACKGROUND

The technical field is related to a semiconductor device and a method for manufacturing the semiconductor device.

In semiconductor devices with substantially small sizes, short-channel effects may lead to unsatisfactory performance of the semiconductor devices. A semiconductor device may be implemented with a fin structure for mitigating short-channel effects. Nevertheless, punch-through currents (or leakage currents) in the fin structure may undesirably affect performance of the semiconductor device.

For minimizing punch-through currents, a high-energy implantation process may be performed to dope a portion of the fin structure to a high impurity concentration. Nevertheless, the high-energy implantation process may cause damage to the fin structure. As an example, FIG. 1 shows an image that illustrates a fin structure 100 of a semiconductor device. A portion 101 of the fin structure 100 has been substantially damaged (e.g., narrowed) in a high-energy implantation process. Because of the damage of the fin structure 100, reliability and/or performance of the semiconductor may be unsatisfactory.

SUMMARY

An embodiment may be related to a method for manufacturing a semiconductor device. The method may include the following steps: preparing a semiconductor structure, which may include a substrate and a first fin member, wherein the first fin member may be connected to the substrate and may include a first semiconductor portion; providing a first-type dopant member, which may directly contact the first semiconductor portion, may include first-type dopants, and may be liquid (or wet) and/or amorphous (or non-crystalline); and performing heat treatment on at least one of the first-type dopant member and the first semiconductor portion to enable a first portion of the first-type dopants to diffuse through a first side of the first-type dopant member into the first semiconductor portion.

The method may include the following steps: before providing the first-type dopant member, forming a repair layer on a first pre-repair fin member; and removing the repair layer to reveal the first fin member. The repair layer may be an oxide layer.

The method may include the following step: before providing the first-type dopant member, treating a surface of the first semiconductor portion to increase hydrophilicity of the surface of the first semiconductor portion. The first-type dopant member may directly contact the surface of the first semiconductor portion.

The method may include the following steps: providing a solution that includes polar molecules related to the first-type dopants; and evaporating the solution to enable a portion of the solution to adhere to the first semiconductor portion for forming the first-type dopant member.

The method may include the following steps: proving a barrier that directly contacts a second side of the first-type dopant member; and during the heat treatment, using the barrier to block a second portion of the first-type dopants at the second side of the first-type dopant member. The second side of the first-type dopant member may be opposite the first side of the first-type dopant member. The second side of the first-type dopant member may not be parallel to the first side of the first-type dopant member.

The method may include the following steps: providing a second-type dopant member, which may directly contact a second semiconductor portion; and using the heat treatment to enable a first portion of the second-type dopants to diffuse from the second-type dopant member to the second semiconductor. The second-type dopant member may include second-type dopants and may be at least one of liquid and amorphous. The semiconductor structure may include a second fin member. The second fin member may include the second semiconductor portion.

The second-type dopant member may directly contact the first-type dopant member.

The method may include the following steps: providing a first barrier, which may directly contact each of the first-type dopant member and the second-type dopant member; and using the first barrier to limit movement of a second portion of the first-type dopants and movement of a second portion of the second-type dopants during the heat treatment.

A first part of the second-type dopant member may directly contact the second semiconductor portion. A second part of the second-type dopant member may be spaced from the first part of the second-type dopant member, may be connected through a third part of the second-type dopant member to the first part of the second-type dopant member, may be positioned between the first part of the second-type dopant member and the first barrier, and may directly contact the first barrier.

The method may include the following steps: providing a second barrier; using a first section of the second barrier to limit movement of a third portion of the second-type dopants during the heat treatment; and using a second section of the second barrier to limit movement of a fourth portion of the second-type dopants during the heat treatment. The first section of the second barrier may directly contact a first part of the second-type dopant member. The first part of the second-type dopant member may directly contact the second semiconductor portion. The second section of the second barrier may directly contact a second part of the second-type dopant member, may be spaced from the first section of the second barrier, and may be connected through a third section of the second barrier to the first section of the second barrier. The second part of the second-type dopant member may directly contact the first barrier.

The method may include the following steps: providing a first-type dopant layer on the first fin member, wherein the first-type dopant layer may include a first dopant-layer portion and a second dopant-layer portion and may be at least one of liquid and amorphous, and wherein the second dopant-layer portion may be positioned between the first dopant-layer portion and the substrate; and before the heat treatment, removing the first dopant-layer portion, wherein the second dopant-layer portion may remain on the first semiconductor portion to be the first-type dopant member.

The method may include the following steps: treating a surface of the first fin member to increase hydrophilicity of the surface of the first fin member; providing a solution that includes polar molecules related to the first-type dopants;

and evaporating the solution to enable a portion of the solution to adhere to the first fin member to form the first-type dopant layer.

The method may include the following steps: providing a first barrier layer on the first-type dopant layer, wherein the first-type dopant layer may be positioned between the first fin member and the first barrier layer, wherein the first barrier layer may include a first barrier portion and a second barrier portion, and wherein the second barrier portion may be positioned between the first barrier portion and the substrate; before the heat treatment, removing the first barrier portion, wherein the second barrier portion may remain on the first-type dopant member; and during the heat treatment, using the second barrier portion to block a second portion of the first-type dopants at a second side of the first-type dopant member.

The method may include the following step: providing a second-type dopant layer on the first fin member and on a second fin member. The semiconductor structure may include the second fin member. The first-type dopant layer and the first barrier layer may be positioned between the first fin member and the second-type dopant layer. The second-type dopant layer may directly contact each of the first barrier layer and the second fin member. The second fin member may include a second semiconductor portion. The second-type dopant layer may include a first dopant-layer part and a second dopant layer part and may be at least one of liquid and amorphous. The second dopant-layer part may be positioned between the first dopant-layer part and the substrate.

The method may include the following step: removing the first dopant-layer part in a process of removing the first dopant-layer portion. The second dopant-layer part may remain as a second-type dopant member and may directly contact the second semiconductor portion.

The method may include the following step: using the heat treatment to enable a first portion of the second-type dopants to diffuse through a first side of the second-type dopant member into the second semiconductor portion.

The method may include the following step: providing a second barrier layer on the first fin member and the second fin member. The second barrier layer may directly contact the second-type dopant layer. The second barrier layer may include a first barrier part and a second barrier part. The second barrier part may be positioned between the first barrier part and the substrate.

The method may include the following step: removing the first barrier part in a process of removing the first barrier portion. The second barrier part remains on the second-type dopant member.

The method may include the following step: during the heat treatment, using the second barrier part to block a second portion of the second-type dopants at a second side of the second-type dopant member.

An embodiment may be related to an intermediate semiconductor device formed in a process of manufacturing a semiconductor device. The intermediate semiconductor device may include the following elements: a substrate; a first fin member, which may be connected to the substrate and may include a first semiconductor portion; and a first-type dopant member, which may directly contact the first semiconductor portion, may include first-type dopants, and may be at least one of liquid and amorphous.

The intermediate semiconductor device may include a first barrier, which may directly contact the first-type dopant member. The first-type dopant member may be positioned between the first semiconductor portion and the first barrier.

The intermediate semiconductor device may include a second fin member, which may be connected to the substrate and may include a second semiconductor portion.

The intermediate semiconductor device may include a second-type dopant member. A first part of the second-type dopant member may directly contact the second semiconductor portion. A second part of the second-type dopant member may be spaced from the first part of the second-type dopant member, may be connected through a third part of the second-type dopant member to the first part of the second-type dopant member, may be positioned between the first part of the second-type dopant member and the first barrier, and may directly contact the first barrier. The first barrier may be positioned between the first-type dopant member and the second part of the second-type dopant member.

According to embodiments, through diffusion of dopants, one or more punch-through current stoppers may be implemented in one or more fin members of the semiconductor device. The implementation of the stopper(s) may not require a high-energy implantation process and may not cause significant damage to the fin member(s). Advantageously, satisfactory performance of the semiconductor device may be attained.

The above summary is related to some of many embodiments disclosed herein and is not intended to limit the scope of embodiments.

DETAILED DESCRIPTION

Figure 1:
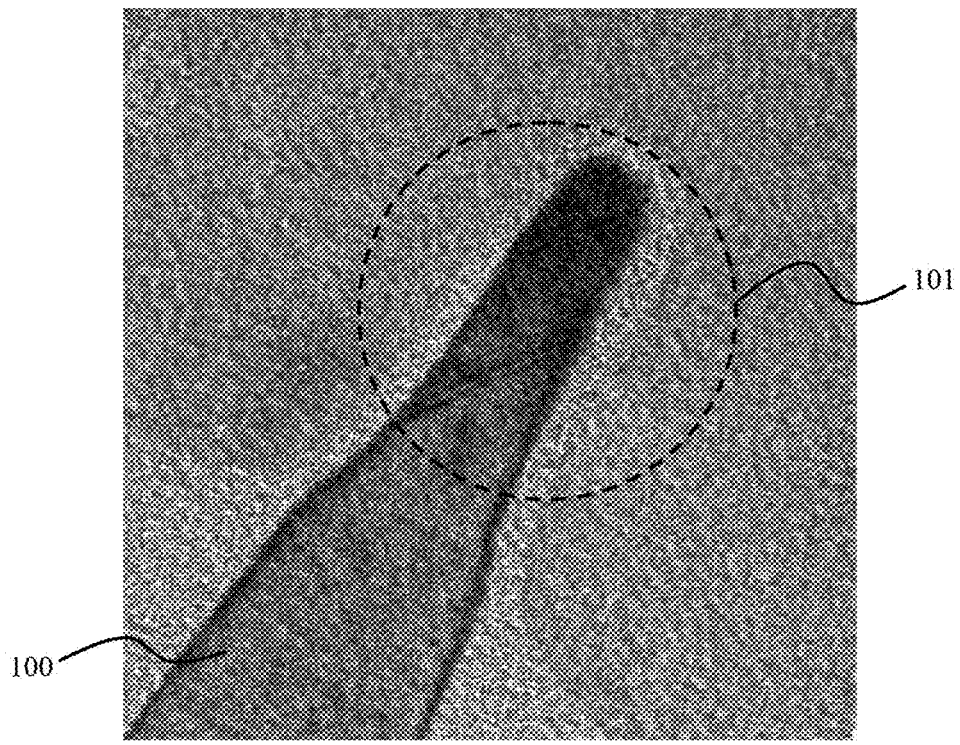
FIG. 1 shows an image that illustrates a fin structure 100 of a semiconductor device.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors".

The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

Figure 2:
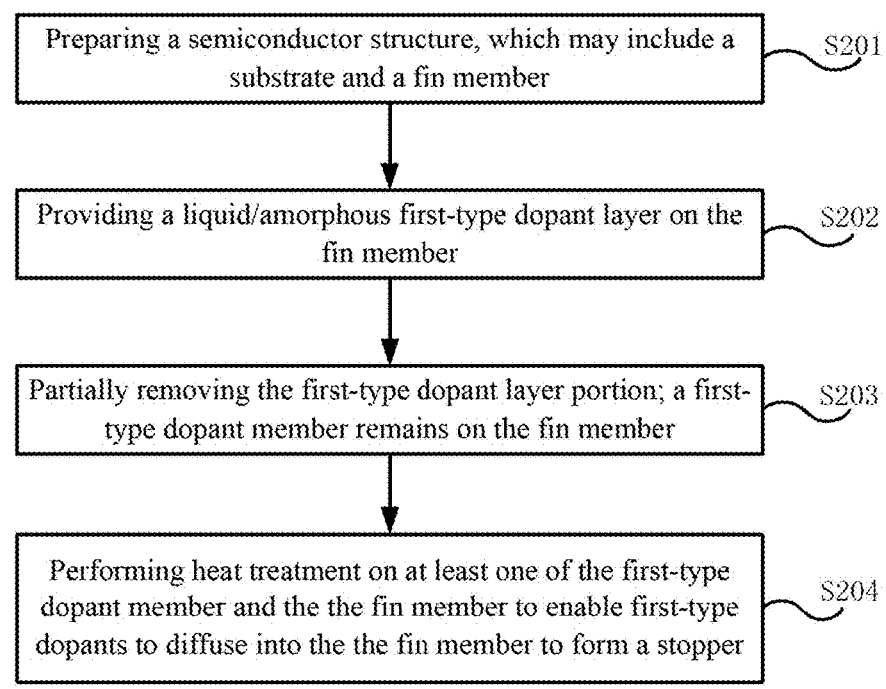
FIG. 2 shows a flowchart that illustrates steps in a method for manufacturing a semiconductor device in accordance with one or more embodiments.

FIG. 2 shows a flowchart that illustrates steps in a method for manufacturing a semiconductor device in accordance with one or more embodiments. The method may include steps S201, S202, S203, and S204. FIG. 3A, FIG. 3B, FIG. 3C, and FIG. 3D show schematic diagrams (e.g., schematic cross-sectional views) that illustrate elements and/or structures formed in the method for manufacturing the semiconductor device in accordance with one or more embodiments.

Figure 3A:
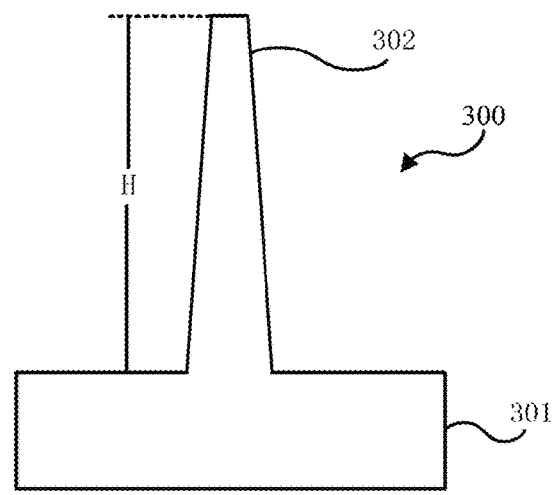
FIG. 3A, FIG. 3B, FIG. 3C, and FIG. 3D show schematic diagrams (e.g., schematic cross-sectional views) that illustrate elements and/or structures formed in a method for manufacturing a semiconductor device in accordance with one or more embodiments.

Referring to FIG. 2 and FIG. 3A, the step S201 may include preparing a semiconductor structure 300, which may include a substrate 301 and a fin member 302.

The substrate 301 may be or may include at least one of a monocrystalline silicon (mono-Si) substrate layer, a polycrystalline silicon (poly-Si) substrate layer, a silicon-on-insulator (SOI) substrate layer, a stacked silicon-on-insulator (SSOI) substrate layer, a stacked silicon-germanium-on-insulator (S—SiGeOI) substrate layer, a silicon-germaniumon-insulator (SiGeOI) substrate layer, a germanium-on-insulator (GeOI) substrate, a germanium (Ge) layer, and a III-V compound semiconductor layer.

The fin member 302 may be (directly) connected to the substrate 301, may have a height H measured from a top surface of the substrate 301, and may include a first semiconductor portion. The first semiconductor portion may be a lower portion of the fin member 302. The fin member 302 may be a semiconductor fin member. The fin member 302 may be formed of an intrinsic semiconductor material.

In an embodiment, the step S201 may include the following sub-steps: providing a patterned mask (e.g., a hard mask or a photoresist mask) on a semiconductor material layer; and performing etching (e.g., dry etching and/or wet etching) through the patterned mask on the semiconductor material layer to form the fin member 302. The fin member 302 may be used for forming an n-channel transistor or a p-channel transistor.

Figure 3B:
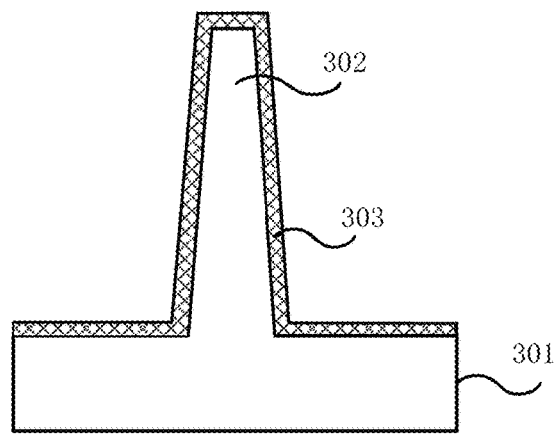

Referring to FIG. 2, FIG. 3A, and FIG. 3B, subsequent to the step S201, the step S202 may include providing a first-type dopant layer 303 on the fin member 302. The first-type dopant layer 303 may be liquid (or wet) and/or amorphous (or non-crystalline) and may include first-type dopants.

In an embodiment, the fin member 302 may be used for forming an n-channel transistor, and the first-type dopant layer 303 may be a p-type dopant layer that includes p-type dopants, such as boron dopants, indium dopants, and/or gallium dopants.

In an embodiment, the fin member 302 may be used for forming a p-channel transistor, and the first-type dopant layer 303 may be an n-type dopant layer that includes n-type dopants, such as phosphorus dopants, arsenic dopants, and/or antimony dopants.

A wet forming process and/or a wet extension process may be used for forming the first-type dopant layer 303. A wet forming process is described with reference to FIG. 4.

Figure 3C:
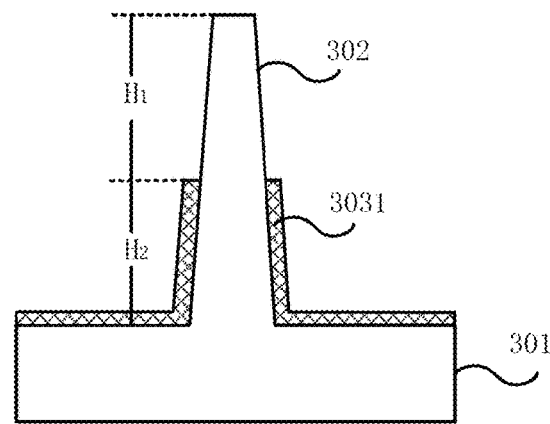
Figure 4:
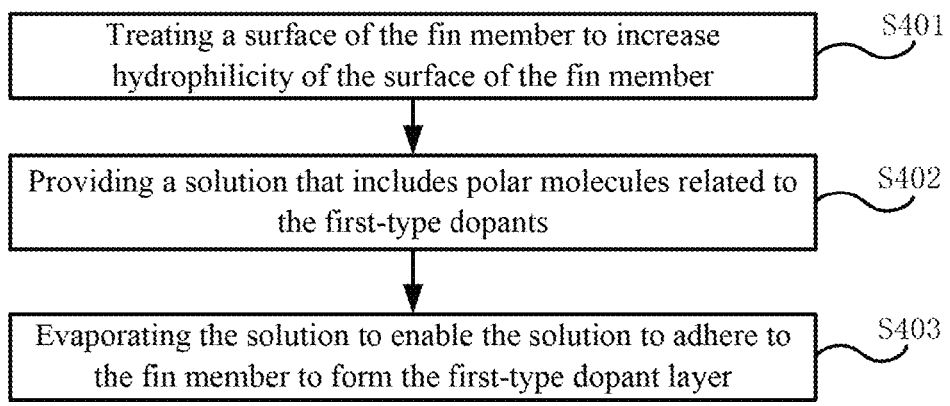
FIG. 4 shows a flowchart that illustrates steps in a method for manufacturing a semiconductor device in accordance with one or more embodiments.

FIG. 4 shows a flowchart that illustrates steps in a method for manufacturing a semiconductor device in accordance with one or more embodiments. The method may include steps S401, S402, and S403. The step S401 may include treating a surface of the fin member 302 illustrated in FIG. 3A to increase hydrophilicity of the surface of the fin member 302. The step S402 may include providing a solution that includes polar molecules related to the first-type dopants. For example, the solution may include polar molecules with boron or phosphorus. The step S403 may include evaporating the solution to enable at least a portion of the solution to adhere to the fin member 302 to form the first-type dopant layer 303 illustrated in FIG. 3B, wherein the first-type dopant layer 303 may include the first-type dopant member 3031 illustrated in FIG. 3C.

In an embodiment, the first-type dopant layer 303 may be formed through a wet process that involves liquid-phase epitaxial growth. The process may include the following steps: melting and saturating silicon in a eutectic mixture that comprises dopants and a metal, wherein the eutectic mixture may be, for example, a boron-gold mixture or a phosphorous-gold mixture and may have a temperature in a range of about 700 degrees Celsius to about 900 degrees Celsius; subsequently, enabling the silicon-containing mixture to directly contact the fin member 302; and subsequently, gradually reducing the temperature of the silicon-containing mixture and/or the fin member 302, such that silicon may precipitate on the surface of the fin member 302 to form an epitaxial layer, and such that dopants, e.g., boron dopants or phosphorous dopants, may diffuse from the eutectic mixture into the epitaxial layer. As a result, the epitaxial layer containing dopants may become the first-type dopant layer 303.

In an embodiment, the first-type dopant layer 303 may be an amorphous layer, e.g., an amorphous boron layer or an amorphous phosphorus layer. The amorphous layer may be formed using a chemical vapor deposition process or a thermal evaporation process. The step S202 may include evaporating boron powders at about 1000 degrees Celsius, such that an amorphous boron layer may form on the fin member 302 as the first-type dopant layer 303.

Referring to FIG. 2, FIG. 3B, and FIG. 3C, subsequent to the step S202, the step S203 may include removing a first dopant-layer portion of the first-type dopant layer 303, which may have covered a first portion of the fin member 302 having a height $H_1$, wherein $H > H_1 > 0$. A second dopant-layer portion of the first-type dopant layer 303 may have been positioned between the substrate 301 and the first dopant-layer portion of the first-type dopant layer 303 and may cover a second portion of the fin member 302 having a height $H_2$, wherein $H_2$ may be substantially equal to $H - H_1$. The second dopant-layer portion of the first-type dopant layer 303 may remain on the first semiconductor portion (or the fin member 302) to be a first-type dopant member 3031. The first-type dopant member 3031 may directly contact the first semiconductor portion (or the fin member 302), may include first-type dopants, and may be liquid (or wet) and/or amorphous (or non-crystalline).

The step S203 may include the following sub-steps: forming a sacrificial layer that covers the second dopant-layer portion of the first-type dopant layer 303 and exposes the first dopant-layer portion of the first-type dopant layer 303; removing the first dopant-layer portion of the first-type dopant layer 303; and removing the sacrificial layer.

Figure 3D:
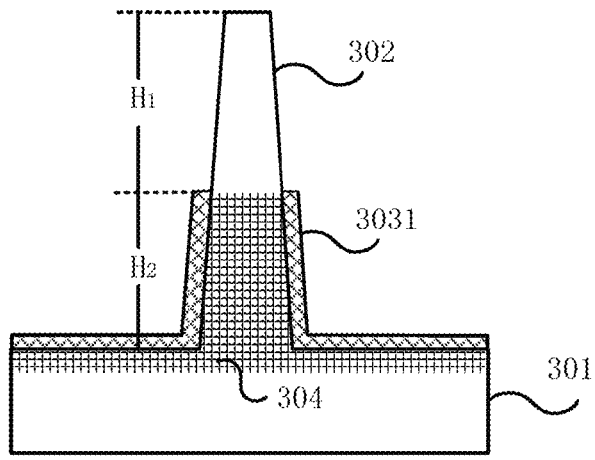

Referring to FIG. 2, FIG. 3C, and FIG. 3D, subsequent to the step S203, the step S204 may include performing heat treatment, e.g., annealing, on at least one of the first-type dopant member 3031 and the first semiconductor portion (or the fin member 302) to enable a first portion of the first-type dopants to diffuse through a first side of the first-type dopant member 3031 (i.e., a side of the first-type dopant member 3031 that directly contacts the fin member 302) into the first semiconductor portion (or the fin member 302) to form a punch-through-current stopper 304. The stopper 304 may include the second portion of the fin member 302 (having the height $H_2$). The stopper 304 may include part of the substrate 301 and/or may include part of the first portion of the fin member 302 (having the height $H_1$). The method may include controlling diffusion of first-type dopants for controlling dimensions and/or coverage of the stopper 304.

The stopper 304 has a higher impurity concentration than an upper portion of the fin member 302 (which may serve as a channel of a transistor). The stopper 304 may effectively minimize or prevent current leakage. The formation of the stopper 304 may not involve any high-energy implantation processes. Therefore, the fin member 302 may not be significantly damaged, and quality and/or performance of the fin member 302 may be substantially maintained.

Figure 5:
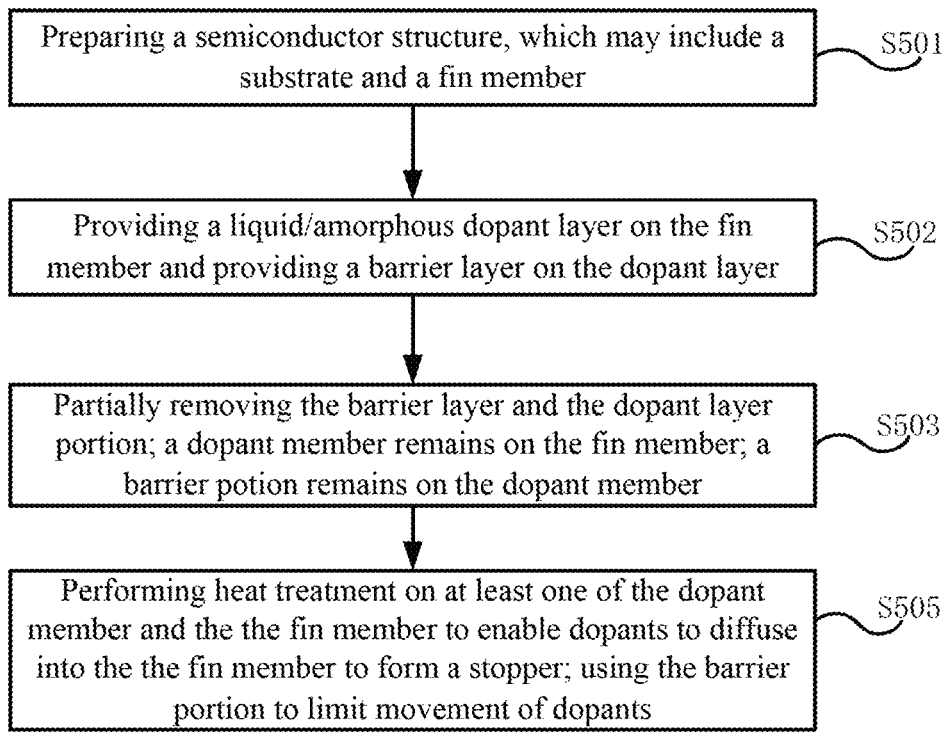
FIG. 5 shows a flowchart that illustrates steps in a method for manufacturing a semiconductor device in accordance with one or more embodiments.

FIG. 5 shows a flowchart that illustrates steps in a method for manufacturing a semiconductor device in accordance with one or more embodiments. The method may include steps S501, S502, S503, and S504. FIG. 6A, FIG. 6B, FIG. 6C, and FIG. 6D show schematic diagrams (e.g., schematic cross-sectional views) that illustrate elements and/or structures formed in the method for manufacturing the semiconductor device in accordance with one or more embodiments.

Figure 6A:
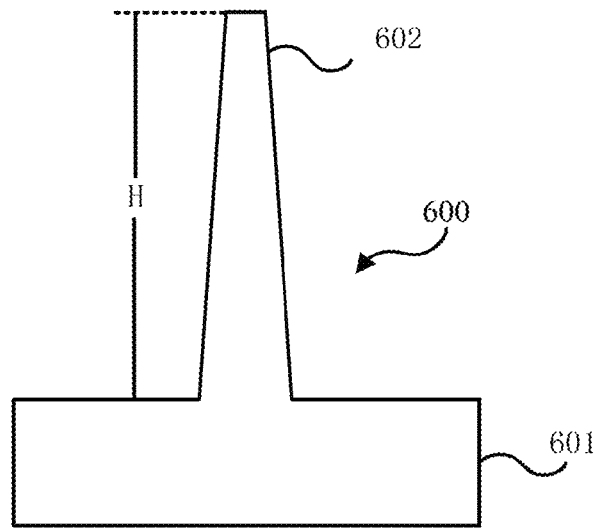
FIG. 6A, FIG. 6B, FIG. 6C, and FIG. 6D show schematic diagrams (e.g., schematic cross-sectional views) that illustrate elements and/or structures formed in a method for manufacturing a semiconductor device in accordance with one or more embodiments.

Referring to FIG. 5 and FIG. 6A, the step S501 may include preparing a semiconductor structure 600, which may include a substrate 601 and a fin member 602.

The substrate 601 may be or may include at least one of a monocrystalline silicon (mono-Si) substrate layer, a polycrystalline silicon (poly-Si) substrate layer, a silicon-on-insulator (SOI) substrate layer, a stacked silicon-on-insulator (SSOI) substrate layer, a stacked silicon-germanium-on-insulator (S—SiGeOI) substrate layer, a silicon-germanium-on-insulator (SiGeOI) substrate layer, a germanium-on-insulator (GeOI) substrate, a germanium (Ge) layer, and a III-V compound semiconductor layer.

The fin member 602 may be (directly) connected to the substrate 601, may have a height H measured from a top surface of the substrate 601, and may include a first semiconductor portion. The first semiconductor portion may be a lower portion of the fin member 602. The fin member 602 may be a semiconductor fin member. The fin member 602 may be formed of an intrinsic semiconductor material.

Figure 6B:
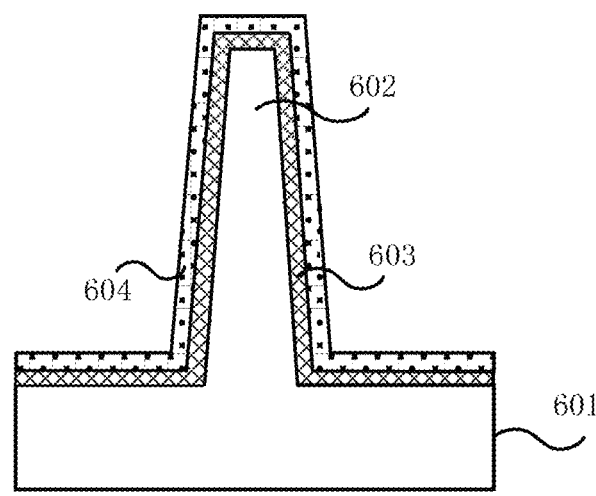

Referring to FIG. 5, FIG. 6A, and FIG. 6B, subsequent to the step S501, the step S502 may include providing a first-type dopant layer 603 on the fin member 602 and providing a barrier layer 604 on the first-type dopant layer 603.

The barrier layer 604 may be formed using a deposition process, e.g., a chemical vapor deposition (CVD) process. The barrier layer 604 may be or may include at least one of a silicon nitride (SiO) layer, a silicon nitride (SiN) layer, a silicon oxynitride (SiON) layer, a carbon-containing silicon oxynitride (SiOCN) layer, a boron oxynitride (SiOBN) layer, and a silicon carbide (SiC) layer. In an embodiment, the first-type dopant layer 603 is a p-type dopant layer, e.g., a boron dopant layer, and the barrier layer 604 may be a nitride layer, e.g., a silicon nitride layer. In an embodiment, the first-type dopant layer 603 is an n-type dopant layer, e.g., a phosphorus dopant layer, and the barrier layer 604 may be an oxide layer, e.g., a silicon oxide layer.

The first-type dopant layer 603 may include a first dopant-layer portion and a second dopant-layer portion and may be liquid (or wet) and/or amorphous (or non-crystalline). The second dopant-layer portion may be positioned between the first dopant-layer portion and the substrate 601. The barrier layer 604 may include a first barrier portion and a second barrier portion. The second barrier portion may be positioned between the first barrier portion and the substrate 601.

Figure 6C:
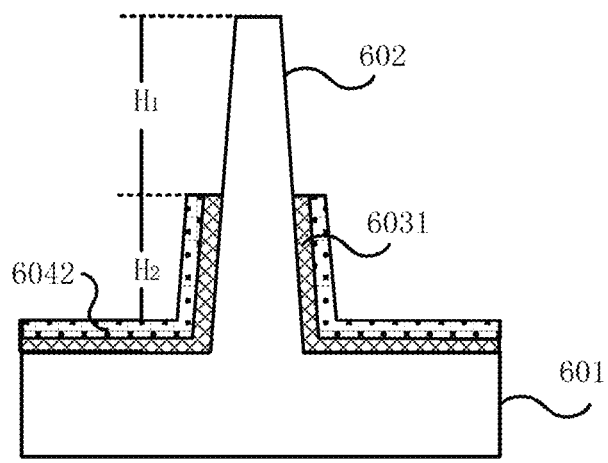

Referring to FIG. 5, FIG. 6B, and FIG. 6C, subsequent to the step S502, the step S503 may include removing both first barrier portion and the first dopant-layer portion, which may have covered a first portion of the fin member 602 having a height $H_1$, wherein $H > H_1 > 0$. The second dopant-layer portion, which may cover a second portion of the fin member 602 having a height $H_2$ (wherein $H_2$ may be substantially equal to $H - H_1$), may remain on the first semiconductor portion (or the fin member 602) to be a first-type dopant member 6031. The first-type dopant member 6031 may directly contact the first semiconductor portion (or the fin member 602), may include first-type dopants, and may be at least one of liquid and amorphous. The second barrier portion 6042 of the barrier layer 604 may remain on the first-type dopant member 6031.

Figure 6D:
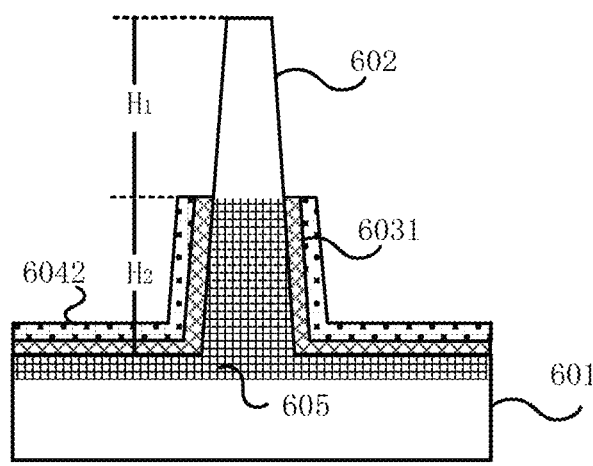

Referring to FIG. 5, FIG. 6C, and FIG. 6D, subsequent to the step S503, the step S504 may include performing heat treatment, e.g., annealing, on at least one of the first-type dopant member 6031 and the first semiconductor portion (or the fin member 602) to enable a first portion of the first-type dopants to diffuse through a first side of the first-type dopant member 6031 (i.e., a side of the first-type dopant member 6031 that directly contacts the fin member 602) into the first semiconductor portion (or the fin member 602) to form a punch-through-current stopper 605. The stopper 605 may include the second portion of the fin member 602 (having the height $H_2$). The stopper 605 may include part of the substrate 601 and/or may include part of the first portion of the fin member 602 (having the height $H_1$).

During the heat treatment, the second barrier portion 6042 may block a second portion of the first-type dopants at a second side of the first-type dopant member 6031 (i.e., a side of the first-type dopant member 6031 that directly contacts the second barrier portion 6042). Advantageously, dopants may effectively diffuse through the first side of the first-type dopant member 6031 into the first semiconductor portion (or the fin member 602) to form the punch-through-current stopper 605.

In an embodiment, the second side of the first-type dopant member 6031 may be opposite (and substantially parallel to) the first side of the first-type dopant member 6031 (which directly contacts the first semiconductor portion of the fin member 602). In an embodiment, the second side of the first-type dopant member 6031 may represent a horizontal side of the first-type dopant member 6031, may be substantially parallel to the top surface of the substrate 601, and may not be parallel to the first side of the first-type dopant member 6031.

Figure 7:
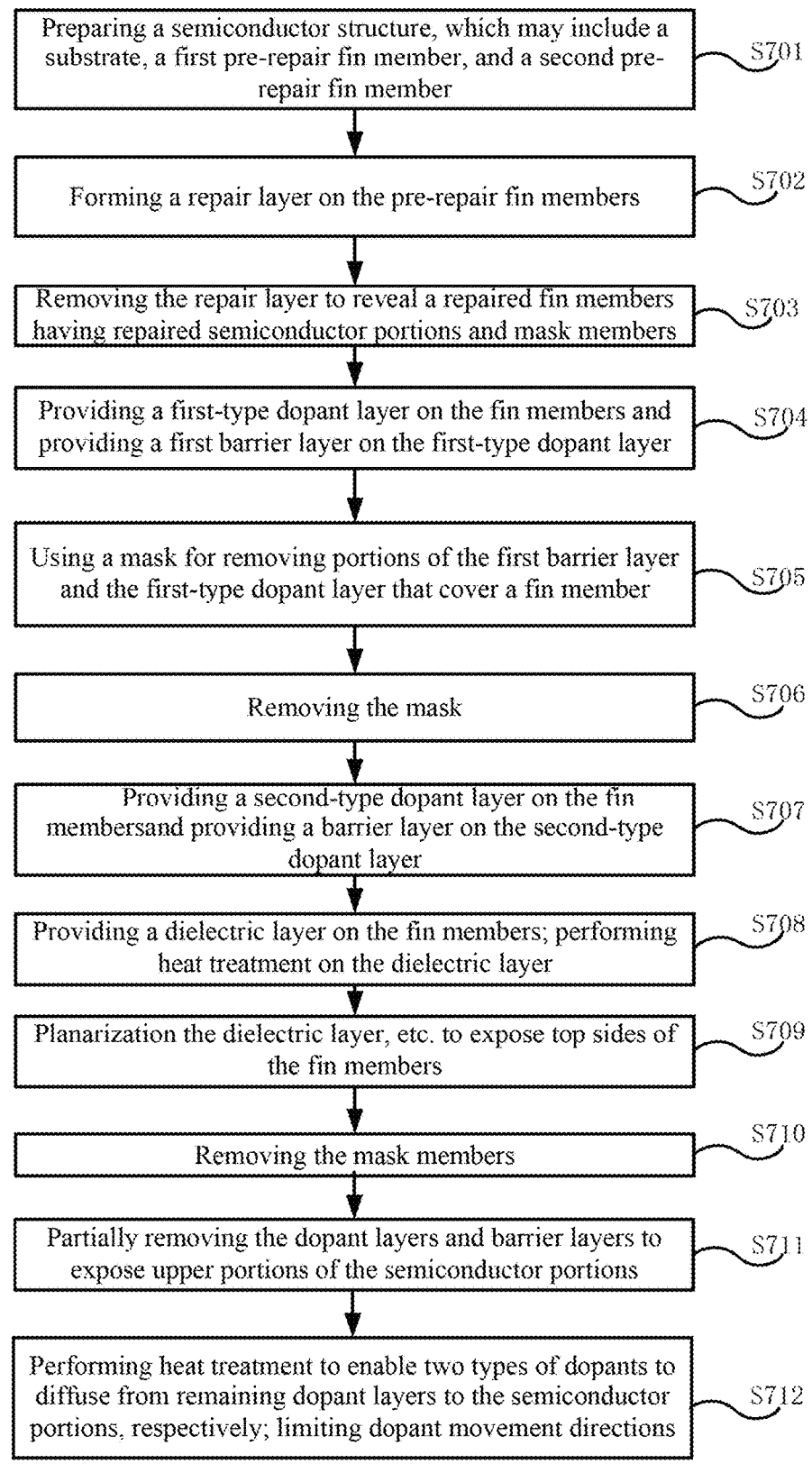
FIG. 7 shows a flowchart that illustrates steps in a method for manufacturing a semiconductor device in accordance with one or more embodiments.

FIG. 7 shows a flowchart that illustrates steps in a method for manufacturing a semiconductor device in accordance with one or more embodiments. The method may include steps S701, S702, S703, S704, S705, S706, S707, S708, S709, S710, S711, and S712. FIG. 8A, FIG. 8B, FIG. 8C, FIG. 8D, FIG. 8E, FIG. 8F, FIG. 8G, FIG. 8H, FIG. 8I, FIG. 8J, FIG. 8K, and FIG. 8L show schematic diagrams (e.g., schematic cross-sectional views) that illustrate elements and/or structures formed in the method for manufacturing the semiconductor device in accordance with one or more embodiments.

Figure 8A:
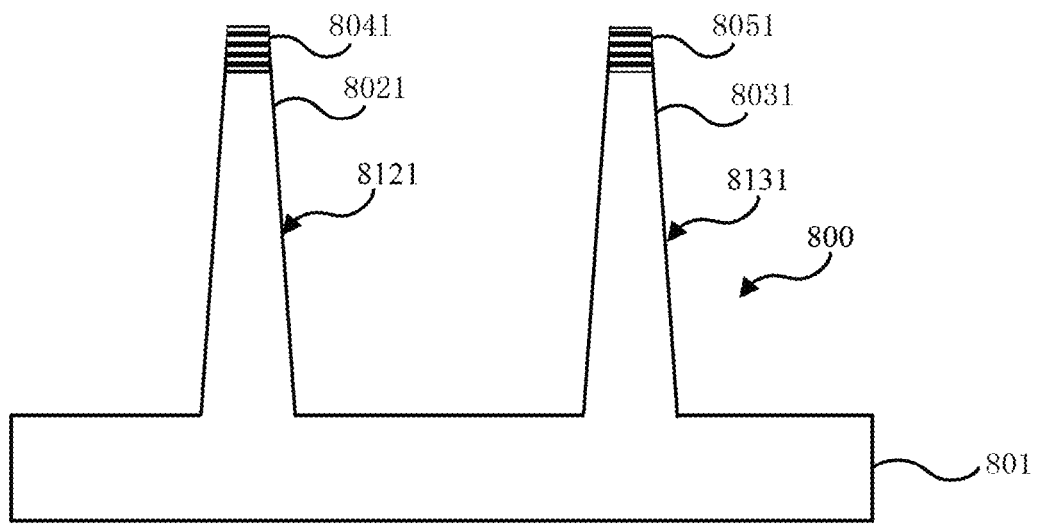
FIG. 8A, FIG. 8B, FIG. 8C, FIG. 8D, FIG. 8E, FIG. 8F, FIG. 8G, FIG. 8H, FIG. 8I, FIG. 8J, FIG. 8K, and FIG. 8L show schematic diagrams (e.g., schematic cross-sectional views) that illustrate elements and/or structures formed in a method for manufacturing a semiconductor device in accordance with one or more embodiments.

Referring to FIG. 7 and FIG. 8A, the step S701 may include preparing a semiconductor structure 800, which may include a substrate 801, a pre-repair fin member 8121, and a pre-repair fin member 8131.

The substrate 801 may be or may include at least one of a monocrystalline silicon (mono-Si) substrate layer, a polycrystalline silicon (poly-Si) substrate layer, a silicon-on-insulator (SOI) substrate layer, a stacked silicon-on-insulator (SSOI) substrate layer, a stacked silicon-germanium-on-insulator (S—SiGeOI) substrate layer, a silicon-germanium-on-insulator (SiGeOI) substrate layer, a germanium-on-insulator (GeOI) substrate, a germanium (Ge) layer, and a III-V compound semiconductor layer.

The fin member 8121 may be (directly) connected to the substrate 801 and may include a semiconductor portion 8021 and a mask member 8041 (e.g., a hard mask member 8041). The fin member 8131 may be (directly) connected to the substrate 801 and may include a semiconductor portion 8031 and a mask member 8051 (e.g., a hard mask member 8051). The semiconductor portion 8021 may be positioned between the mask member 8041 and the substrate 801. The semiconductor portion 8031 may be positioned between the mask member 8051 and the substrate 801. The mask members 8041 and 8051 may be formed of silicon oxide and/or silicon nitride. In an embodiment, the fin member 8121 may include the semiconductor portion 8021 without including the mask member 8041, and/or the fin member 8131 may include the semiconductor portion 8031 without including the mask member 8051.

Figure 8B:
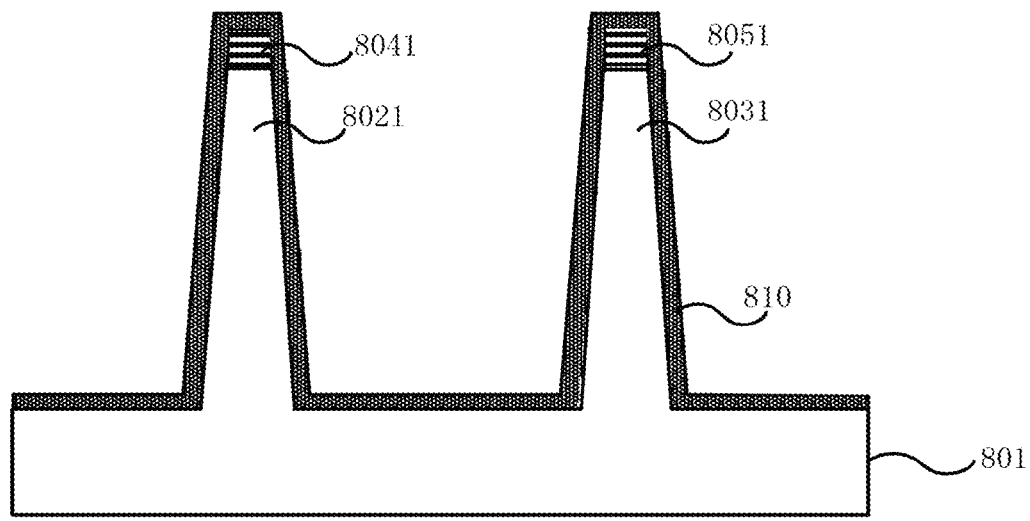

Referring to FIG. 7, FIG. 8A, and FIG. 8B, subsequent to the step S701, the step S702 may include forming a repair layer 810 on the fin member 8121 and 8131. The repair layer 810 may be an oxide layer, e.g., a silicon oxide layer. The repair layer 810 may be formed using an in-situ steam generation (ISSG) process or a rapid thermal oxidation (RTO) process. In the step S702, high-density gaseous oxygen radicals may be provided and may react with surfaces of the fin members 8121 and 8131 to form the repair layer 810.

Figure 8C:
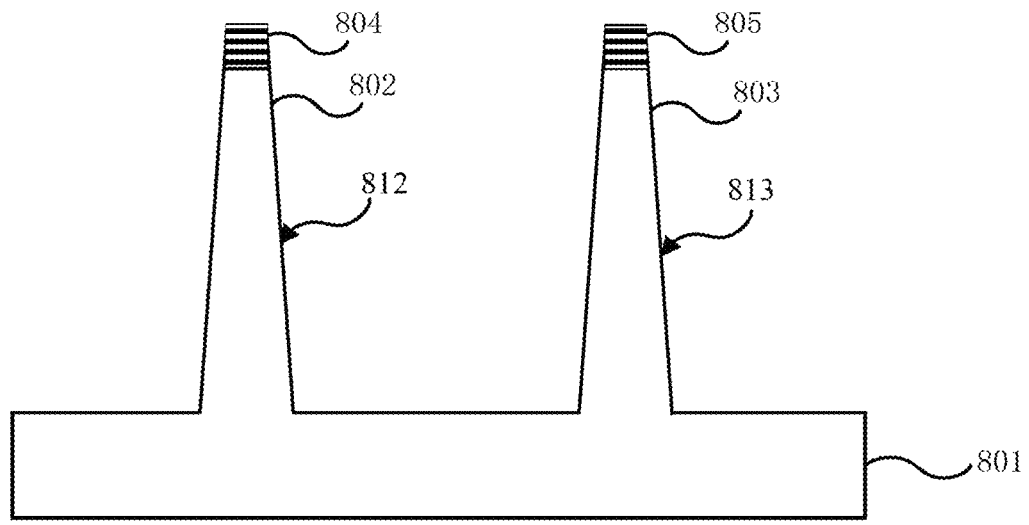

Referring to FIG. 7, FIG. 8B, and FIG. 8C, subsequent to the step S702, the step S703 may include removing the repair layer 810 to reveal a repaired fin member 812 (which is resulted from surface-repair of the fin member 8121) and a repaired fin member 813 (which is resulted from surface-repair of the fin member 8131). The fin member 812 may be (directly) connected to the substrate 801 and may include a repaired semiconductor portion 802 and a mask member 804 (e.g., a hard mask member 804). The fin member 813 may be (directly) connected to the substrate 80 and may include a repaired semiconductor portion 803 and a mask member 805 (e.g., a hard mask member 805). The semiconductor portion 802 may be positioned between the mask member 804 and the substrate 801. The semiconductor portion 803 may be positioned between the mask member 805 and the substrate 801.

Figure 8D:
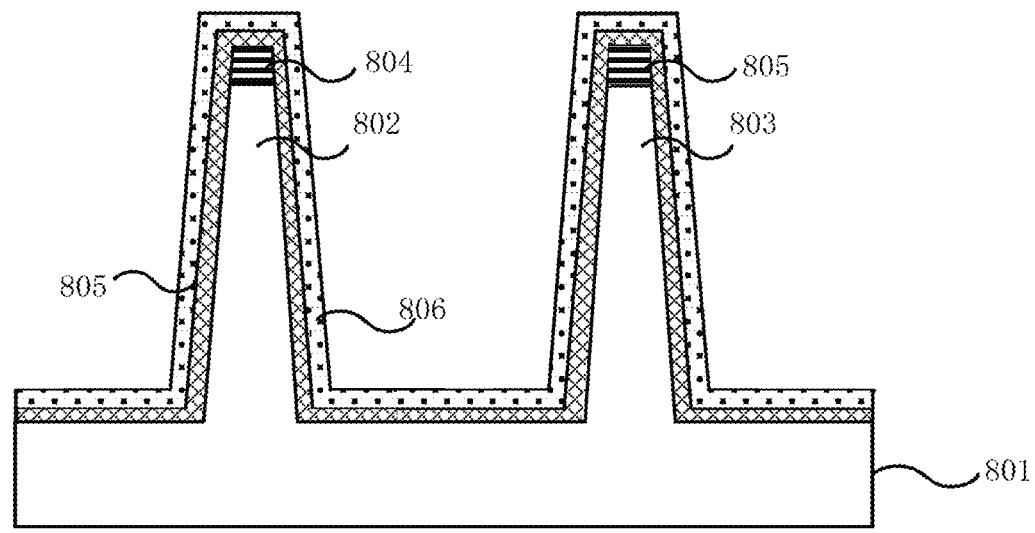

Referring to FIG. 7, FIG. 8C, and FIG. 8D, subsequent to the step S703, the step S704 may include providing a first-type dopant layer 805 on the fin members 812 and 813 and providing a barrier layer 806 on the first-type dopant layer 805. The first-type dopant layer 805 may be liquid (or wet) and/or amorphous (or non-crystalline).

The step S704 may include sub-steps that are analogous and/or identical to some sub-steps of one or more of the above-described steps S202, S401, S402, S403, and S502.

In an embodiment, the fin member 812 may be used for forming an n-channel transistor, the first-type dopant layer 805 may be a p-type dopant layer, and the fin member 813 may be used for forming a p-channel transistor. In an embodiment, the fin member 812 may be used for forming a p-channel transistor, the first-type dopant layer 805 may be an n-type dopant layer, and the fin member 813 may be used for forming an n-channel transistor.

Figure 8E:
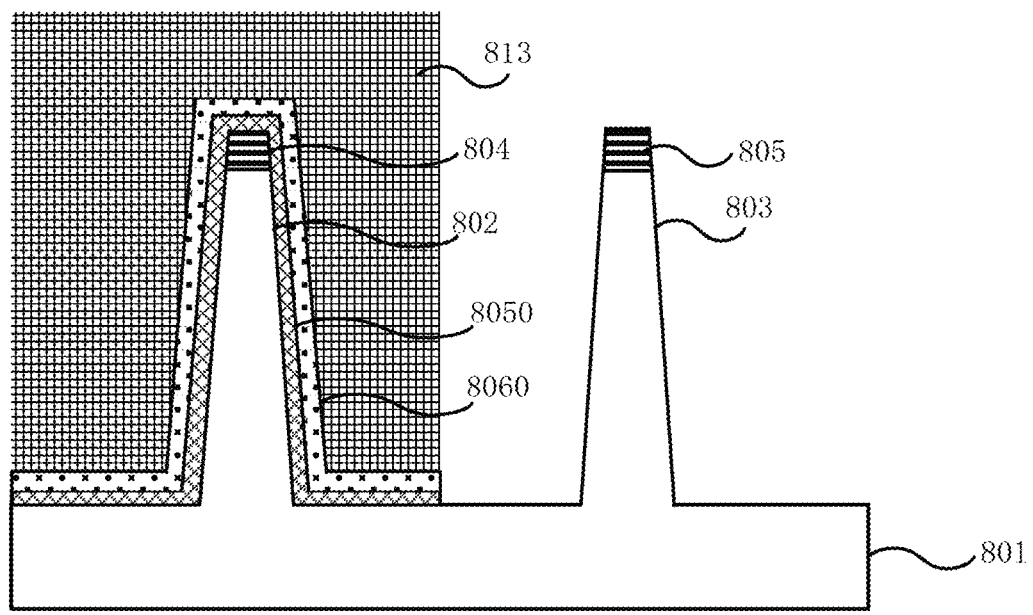

Referring to FIG. 7, FIG. 8D, and FIG. 8E, subsequent to the step S704, the step S705 may include providing a mask 813 (e.g., a photoresist mask) on the fin member 812, such that a barrier layer portion 8060 of the barrier layer 806 and a first-type dopant layer portion 8050 of the first-type dopant layer 805 may be covered by the mask 813, and such that exposed portions of the barrier layer 806 and the first-type dopant layer 805 may not be covered by the mask 813. The step S705 may further include removing the exposed portions he barrier layer 806 and the first-type dopant layer 805.

Figure 8F:
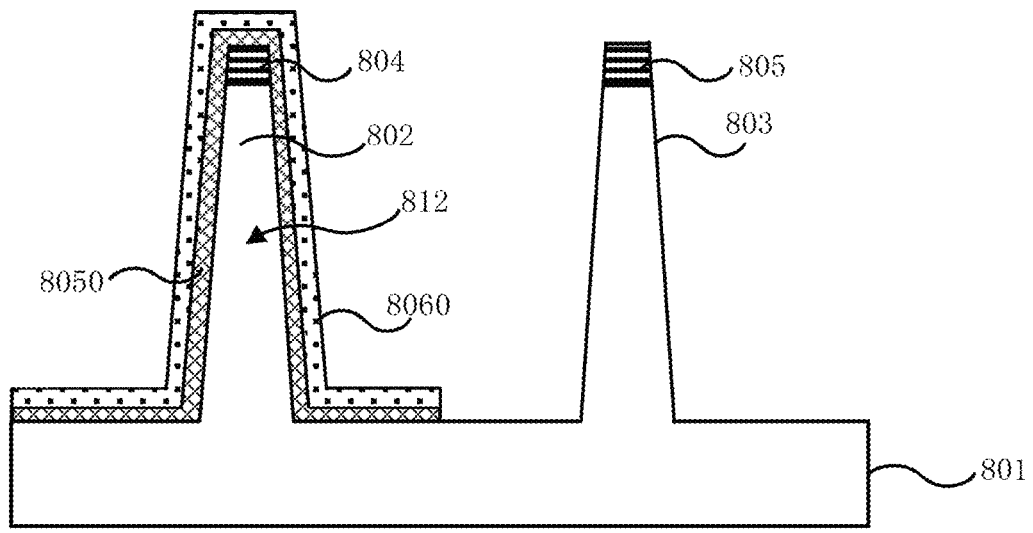

Referring to FIG. 7, FIG. 8E, and FIG. 8F, subsequent to the step S705, the step S706 may include removing the mask 813. The barrier layer portion 8060 and the first-type dopant layer portion 8050 may remain on the first fin 812.

Figure 8G:
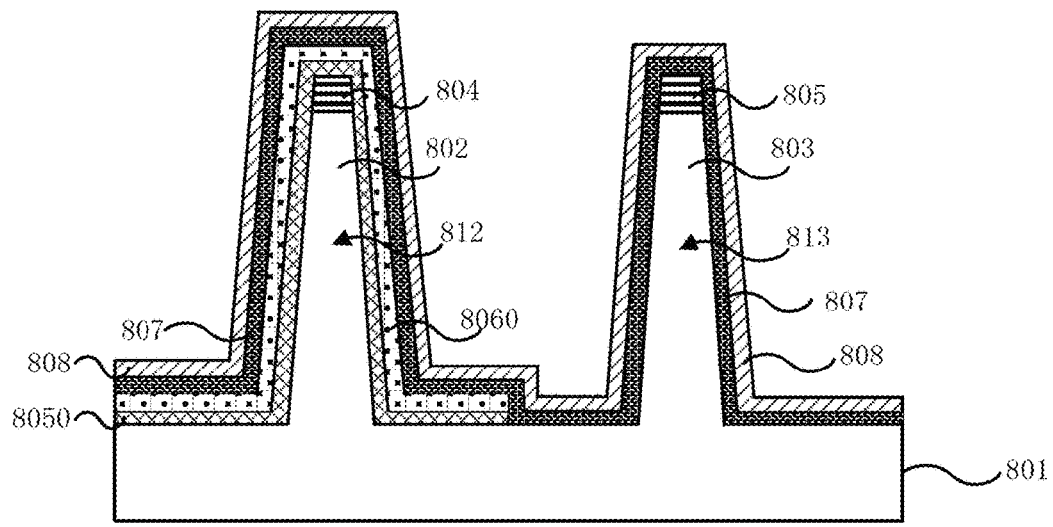

Referring to FIG. 7, FIG. 8F, and FIG. 8G, subsequent to the step S706, the step S707 may include providing a second-type dopant layer 807 on the fin members 812 and 813 and providing a barrier layer 808 on the second-type dopant layer 807. The first-type dopant layer 805 and the barrier layer 806 may be positioned between the fin member 812 and the second-type dopant layer 807. The second-type dopant layer 807 may be liquid (or wet) and/or amorphous (or non-crystalline), may include second-type dopants, may directly contact the barrier layer portion 8060, and may directly contact the fin member 813.

The step S707 may include sub-steps that are analogous and/or identical to some sub-steps of one or more of the above-described steps S202, S401, S402, S403, and S502.

In an embodiment, the fin member 812 may be used for forming an n-channel transistor, the first-type dopant layer 805 may be a p-type dopant layer, the barrier layer 806 may be a nitride layer, the fin member 813 may be used for forming a p-channel transistor, the second-type dopant layer 807 may be an n-type dopant layer, and the barrier layer 808 may be an oxide layer.

In an embodiment, the fin member 812 may be used for forming a p-channel transistor, the first-type dopant layer 805 may be an n-type dopant layer, the barrier layer 806 may be an oxide layer, the fin member 813 may be used for forming an n-channel transistor, the second-type dopant layer 807 may be a p-type dopant layer, and the barrier layer 808 may be a nitride layer.

The second-type dopant layer 807 may include a first dopant-layer part and a second dopant layer part. The second dopant-layer part may be positioned between the first dopant-layer part and the substrate 801. The first dopant-layer part may be removed in a subsequent process of removing a first dopant-layer portion of the first-type dopant layer 805, such that a second dopant-layer portion of the first-type dopant layer 805 may remain as a first-type dopant member 815 (illustrated in FIG. 8K), and such that the second dopant-layer part may remain as a second-type dopant member 817 (illustrated in FIG. 8K).

The barrier layer 808 may include a first barrier part and a second barrier part. The second barrier part may be positioned between the first barrier part and the substrate 801. The first barrier part may be removed in a subsequent process of removing a first barrier portion of the barrier layer 806 (illustrated in FIG. 8K), such that a second barrier portion of the barrier layer 806 may remain as a barrier 816, and such that the second barrier part may remain as a barrier 818 (illustrated in FIG. 8K).

Figure 8H:
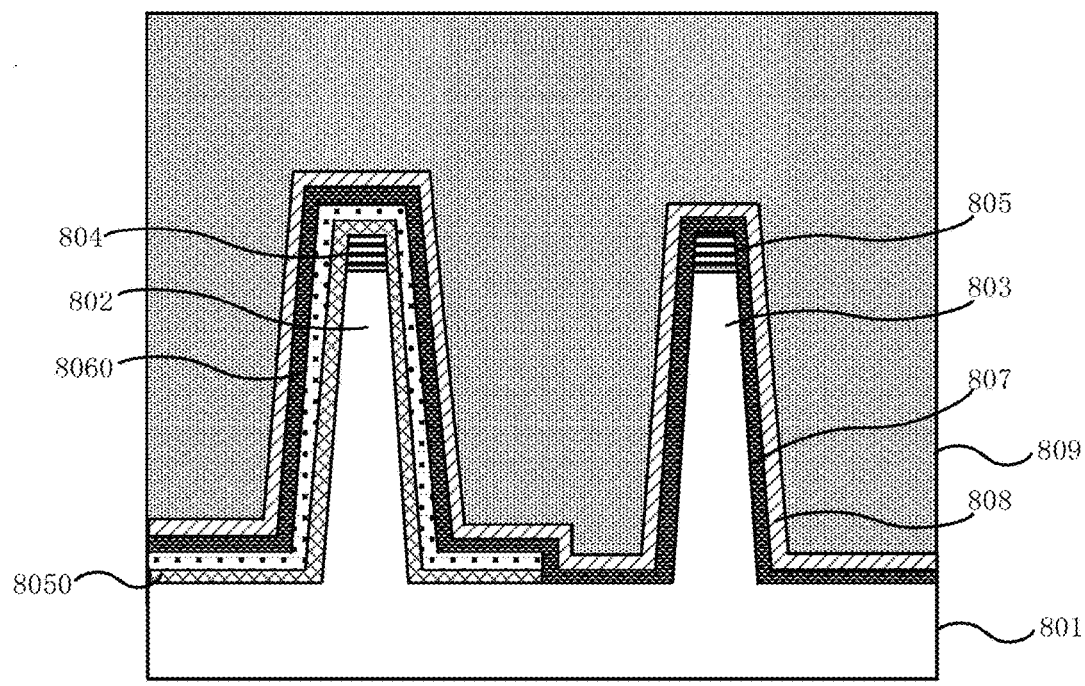

Referring to FIG. 7, FIG. 8G, and FIG. 8H, subsequent to the step S707, the step S708 may include providing a dielectric layer 809 on the fin members 812 and 813 and between the fin members 821 and 813. The dielectric layer 809 may be formed of silicon oxide. The dielectric layer 809 may be formed using at least one of a chemical vapor deposition (CVD) process and a physical vapor deposition (PVD) process. The dielectric layer 809 may directly contact the barrier layer 808. The step S708 may include performing heat treatment on the dielectric layer 809 (or the structure illustrated in FIG. 8H) for optimizing material characteristics of the dielectric layer 809. The heat treatment may include an annealing process performed at about 800 degrees Celsius for 30 minutes.

Figure 8I:
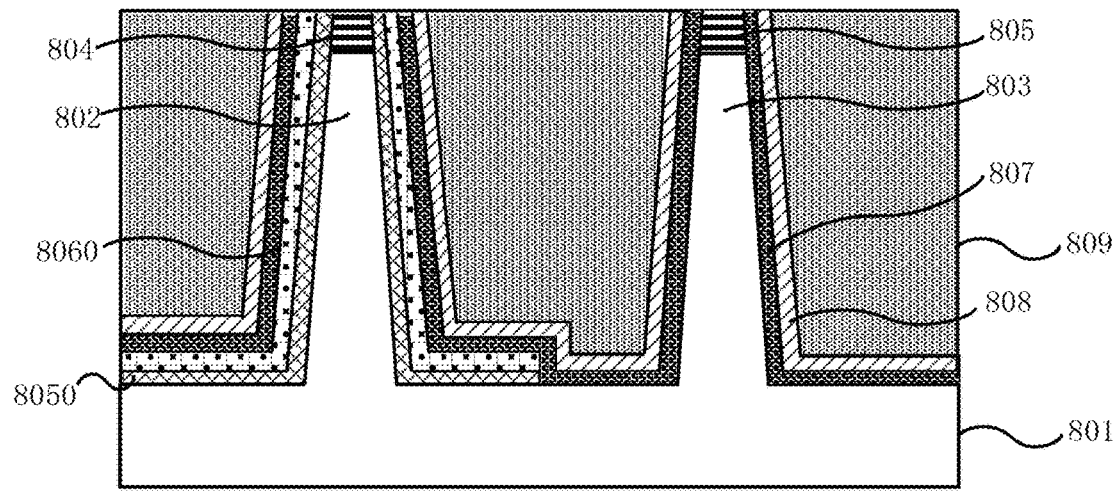

Referring to FIG. 7, FIG. 8H, and FIG. 8I, subsequent to the step S708, the step S709 may include performing a planarization process (e.g., a chemical mechanical planarization process) on the dielectric layer 809, the barrier layer 808, the second-type dopant layer 807, the barrier layer portion 8060, and the first-type dopant layer portion 8050 to expose top sides of the fin members 812 and 813 (e.g., top sides of the mask members 804 and 805).

Figure 8J:
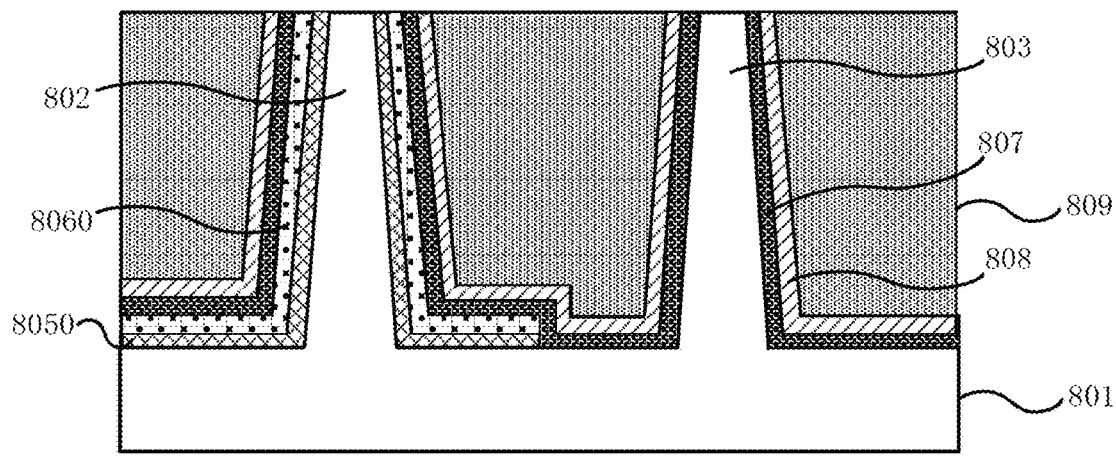

Referring to FIG. 7, FIG. 8I, and FIG. 8J, subsequent to the step S709, the step S710 may include removing the mask members 804 and 805. The mask members 804 and 805 may be removed using at least one of a planarization process (e.g., chemical mechanical planarization process) and an etching process.

Figure 8K:
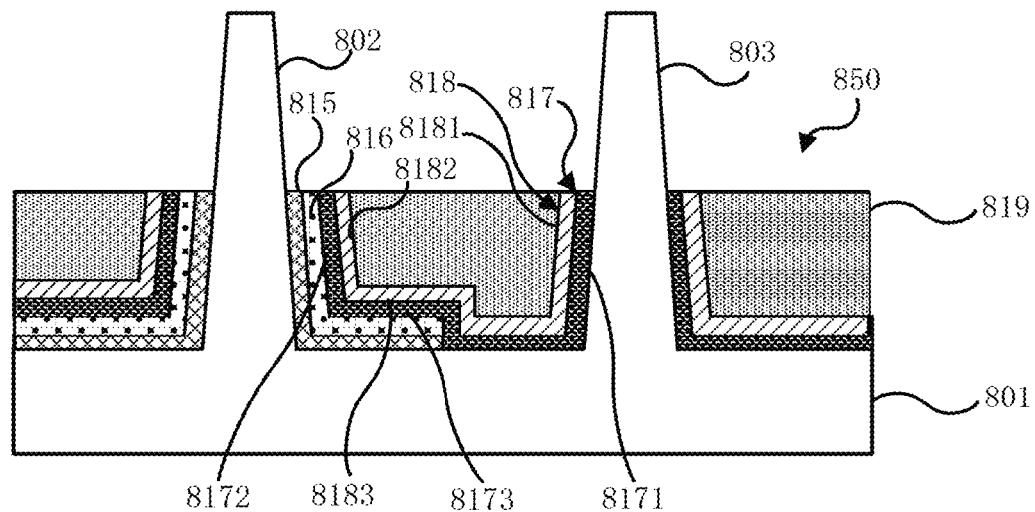

Referring to FIG. 7, FIG. 8J, and FIG. 8K, subsequent to the step S710, the step S711 may include partially removing (the remaining portions of) the layers 8050, 8060, 807, 808, and 809 to expose upper portions of the semiconductor portions 802 and 803. Members/portions 815, 816, 817, 818, and 819 of the layers 8050, 8060, 807, 808, and 809 may remain on the semiconductor portion 802, the semiconductor portion 803, and/or the substrate 801.

FIG. 8K shows a schematic diagram (e.g., a schematic cross-sectional view) that illustrates elements and/or structures in an intermediate semiconductor device 850 formed in a process of manufacturing the semiconductor device. The intermediate semiconductor device 850 may include the following elements: the substrate 801; a first fin member, e.g., the semiconductor portion 802; a second fin member, e.g., the semiconductor portion 803; the first-type dopant member 815; the barrier 816; the second-type dopant member 817; and the barrier 818.

The barrier 816 may be positioned between the first-type dopant member 815 and the second-type dopant member 817 for blocking movement of first-type dopants and second-type dopants in undesirable directions. The barrier 816 may directly contact each of the first-type dopant member 815 and the second-type dopant member 817.

The barrier 818 may be positioned between the dielectric layer 819 and the second-type dopant member 817 for blocking movement of second-type dopants in undesirable directions. The barrier 818 may directly contact each of the dielectric layer 819 and the second-type dopant member 817.

The first-type dopant member 815 may be positioned between the semiconductor portion 802 and the barrier 816. The first-type dopant member 815 may directly contact each of the semiconductor portion 802 and the barrier 816.

The second-type dopant member 817 may directly contact the first-type dopant member 815. A horizontal part 8173 of the second-type dopant member 817 may directly contact a horizontal part of the first-type dopant member 815. A part 8171 of the second-type dopant member 817 may directly contact the semiconductor portion 803. A part 8172 of the second-type dopant member 817 may be spaced from the part 8171 of the second-type dopant member 817, may be connected through the part 8173 of the second-type dopant member 817 to the part 8171 of the second-type dopant member 817, may be positioned between the part 8171 of the second-type dopant member 817 and the barrier 816, and may directly contact the barrier 816. The barrier 816 may be positioned between the first-type dopant member 815 and the part 8172 of the second-type dopant member 817. A horizontal section of the barrier 816 may be positioned between the part 8173 of the second-type dopant member 817 and a horizontal part of the first-type dopant member 815 and may directly contact each of the part 8173 of the second-type dopant member 817 and a horizontal part of the first-type dopant member 815.

Figure 8L:
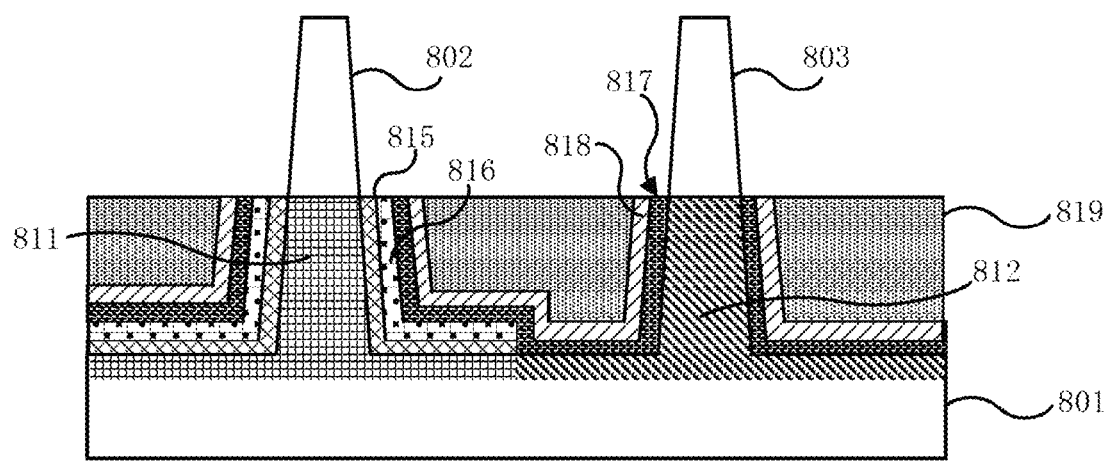

Referring to FIG. 7, FIG. 8K, and FIG. 8L, subsequent to the step S711, the step S712 may include performing heat treatment, e.g., annealing, on at least one of the first-type dopant member 815 (i.e., the portion 815), the semiconductor portion 802, the second-type dopant member 817 (i.e., the portion 817), and the semiconductor portion 803 (or the intermediate semiconductor device 850 illustrated in FIG. 8K) to enable a first portion of the first-type dopants to diffuse through a first side of the first-type dopant member 815 (i.e., a side of the first-type dopant member 815 that directly contacts the semiconductor portion 802) into the semiconductor portion 802 to form a punch-through-current stopper 811, and to enable a first portion of the second-type dopants to diffuse through a first side of the second-type dopant member 817 (i.e., a side of the first-type dopant member 817 that directly contacts the semiconductor portion 803) into the semiconductor portion 803 to form a punch-through-current stopper 812.

The stopper 811 may include a portion of the semiconductor portion 802 (i.e., a portion of the fin member 812) that is covered by the first-type dopant member 815. The stopper 811 may include part of the substrate 801 and/or may include a portion of the semiconductor portion 802 (i.e., a portion of the fin member 812) that is not covered by the first-type dopant member 815. The stopper 812 may include a portion of the semiconductor portion 803 (i.e., a portion of the fin member 813) that is covered by the second-type dopant member 817. The stopper 812 may include part of the substrate 801 and/or may include a portion of the semiconductor portion 803 (i.e., a portion of the fin member 813) that is not covered by the second-type dopant member 817.

During the heat treatment, the barrier 816 (i.e., the barrier portion 816) may block a second portion of the first-type dopants at a second side of the first-type dopant member 815 (i.e., a side of the first-type dopant member 815 that directly contacts the barrier 816), and the barrier 818 (i.e., the barrier portion 818) may block a second portion of the second-type dopants at a second side of the second-type dopant member 817 (i.e., a horizontal side of the second-type dopant member 817 that directly contacts the barrier 818).

A section 8181 of the barrier 818 may directly contact the part 8171 of the second-type dopant member 817. During the heat treatment, the section 8181 of the barrier 818 may black a third portion of the second-type dopants from moving in undesirable directions.

A section 8182 of the barrier 818 may directly contacts the part 8172 of the second-type dopant member 817, may be spaced from the section 8181 of the barrier 818, and may be connected through a section 8183 of the barrier 818 to the section 8181 of the barrier 818. During the heat treatment, the section 8182 of the barrier 818 may block a fourth portion of the second-type dopants from moving in undesirable directions.

According to embodiments, through diffusion of dopants, one or more punch-through current stoppers, such as one or more of the above described stoppers 304, 605, 811, and 812, may be implemented in one or more fin members of a semiconductor device. The implementation of the stopper(s) may not require a high-energy implantation process and may not cause significant damage to the fin member(s). Advantageously, satisfactory performance of the semiconductor device may be attained.

While some embodiments have been described as examples, there are alterations, permutations, and equivalents. It should also be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents.

What is claimed is:

1. A method for manufacturing a semiconductor device, the method comprising:
   preparing a semiconductor structure, which comprises a substrate, a first fin member, and a second fin member, wherein the first fin member is connected to the substrate and comprises a first semiconductor portion, wherein the second fin member is connected to the substrate and comprises a second semiconductor portion;

providing a first-type dopant member, which directly contacts the first semiconductor portion and comprises first-type dopants;

performing heat treatment on at least one of the first-type dopant member and the first semiconductor portion to enable a first portion of the first-type dopants to diffuse through a first side of the first-type dopant member into the first semiconductor portion;

providing a second-type dopant member, wherein a surface of the second-type dopant member directly contacts the second semiconductor portion, and wherein the second-type dopant member comprises second-type dopants;

using the heat treatment to enable a first portion of the second-type dopants to diffuse through the surface of the second-type dopant member to the second semiconductor portion;

providing a first barrier, wherein the first barrier directly contacts each of the first-type dopant member and the second-type dopant member; and using the first barrier to limit movement of a second portion of the first-type dopants and movement of a second portion of the second-type dopants during the heat treatment, wherein a first part of the second-type dopant member directly contacts the second semiconductor portion, and wherein a second part of the second-type dopant member is spaced from the first part of the second-type dopant member, is connected through a third part of the second-type dopant member to the first part of the second-type dopant member, is positioned between the first part of the second-type dopant member and the first barrier, and directly contacts the first barrier.

2. The method of claim 1 comprising:

before providing the first-type dopant member, treating a surface of the first semiconductor portion to increase hydrophilicity of the surface of the first semiconductor portion, wherein the first-type dopant member directly contacts the surface of the first semiconductor portion.

3. The method of claim 2 comprising:

providing a solution that comprises polar molecules related to the first-type dopants; and evaporating the solution to enable a portion of the solution to adhere to the first semiconductor portion for forming the first-type dopant member.

4. The method of claim 1 comprising:

positioning the first barrier to directly contact a second side of the first-type dopant member; and during the heat treatment, using the first barrier to block the second portion of the first-type dopants at the second side of the first-type dopant member.

5. The method of claim 4, wherein the second side of the first-type dopant member is opposite the first side of the first-type dopant member.

6. The method of claim 4, wherein the second side of the first-type dopant member is not parallel to the first side of the first-type dopant member.

7. A method for manufacturing a semiconductor device, the method comprising:

preparing a semiconductor structure, which comprises a substrate and a first fin member, wherein the first fin member is connected to the substrate and comprises a first semiconductor portion;

providing a first-type dopant member, which directly contacts the first semiconductor portion, comprises first-type dopants, and is at least one of liquid and amorphous;

performing heat treatment on at least one of the first-type dopant member and the first semiconductor portion to enable a first portion of the first-type dopants to diffuse through a first side of the first-type dopant member into the first semiconductor portion;

before providing the first-type dopant member, forming a repair layer on a first pre-repair fin member, wherein the repair layer conceals at least three sides of the first pre-repair fin member; and removing the repair layer to reveal the first fin member;

providing a first barrier, wherein the first barrier directly contacts each of the first-type dopant member and the second-type dopant member; and using the first barrier to limit movement of a second portion of the first-type dopants and movement of a second portion of the second-type dopants during the heat treatment, wherein a first part of the second-type dopant member directly contacts the second semiconductor portion, and wherein a second part of the second-type dopant member is spaced from the first part of the second-type dopant member, is connected through a third part of the second-type dopant member to the first part of the second-type dopant member, is positioned between the first part of the second-type dopant member and the first barrier, and directly contacts the first barrier.

8. The method of claim 7, wherein the repair layer is an oxide layer.

9. A method for manufacturing a semiconductor device, the method comprising:

preparing a semiconductor structure, which comprises a substrate, a first fin member, and a second fin member, wherein the first fin member is connected to the substrate and comprises a first semiconductor portion, wherein the second fin member is connected to the substrate and comprises a second semiconductor portion;

providing a first-type dopant member, wherein a first side of the first-type dopant member directly contacts the first semiconductor portion, and wherein the first-type dopant member comprises first-type dopants;

performing heat treatment on at least one of the first-type dopant member and the first semiconductor portion to enable a first portion of the first-type dopants to diffuse through the first side of the first-type dopant member into the first semiconductor portion;

providing a second-type dopant member, wherein a surface of the second-type dopant member directly contacts the second semiconductor portion, and wherein the second-type dopant member comprises second-type dopants, wherein a charge type of the second-type dopants is opposite to a charge type of the first-type dopants; and using the heat treatment to enable a first portion of the second-type dopants to diffuse through the surface of the second-type dopant member to the second semiconductor portion;

providing a first barrier, wherein the first barrier directly contacts each of the first-type dopant member and the second-type dopant member; and using the first barrier to limit movement of a second portion of the first-type dopants and movement of a second portion of the second-type dopants during the heat treatment, wherein a first part of the second-type dopant member directly contacts the second semiconductor portion, and wherein a second part of the second-type dopant member is spaced from the first part of the second-type dopant member, is connected through a third part of the second-type dopant member to the first part of the second-type dopant member, is positioned between the first part of the second-type dopant member and the first barrier, and directly contacts the first barrier.

10. The method of claim 9, wherein the second-type dopant member directly contacts the first-type dopant member.

11. The method of claim 9 comprising:
providing a second barrier;
using a first section of the second barrier to limit movement of a third portion of the second-type dopants during the heat treatment; and
using a second section of the second barrier to limit movement of a fourth portion of the second-type dopants during the heat treatment,
wherein the first section of the second barrier directly contacts a first part of the second-type dopant member,
wherein the first part of the second-type dopant member directly contacts the second semiconductor portion,
wherein the second section of the second barrier directly contacts a second part of the second-type dopant member, is spaced from the first section of the second barrier, and is connected through a third section of the second barrier to the first section of the second barrier, and
wherein the second part of the second-type dopant member directly contacts the first barrier.

12. A method for manufacturing a semiconductor device, the method comprising:
preparing a semiconductor structure, which comprises a substrate and a first fin member, wherein the first fin member is connected to the substrate, comprises a first semiconductor portion, and comprises a second semiconductor portion;
providing a first-type dopant member, which directly contacts the first semiconductor portion and comprises first-type dopants;
performing heat treatment on at least one of the first-type dopant member and the first semiconductor portion to enable a first portion of the first-type dopants to diffuse through a first side of the first-type dopant member into the first semiconductor portion;
providing a first-type dopant layer on the first fin member, wherein the first-type dopant layer comprises a first dopant-layer portion and a second dopant-layer portion and is at least one of liquid and amorphous, and wherein the second dopant-layer portion is positioned between the first dopant-layer portion and the substrate;
before the heat treatment, removing the first dopant-layer portion, wherein the second dopant-layer portion remains on the first semiconductor portion to be the first-type dopant member, and wherein the second semiconductor portion remains on the first semiconductor portion after the first dopant-layer portion has been removed;

providing a first barrier layer on the first-type dopant layer, wherein the first-type dopant layer is positioned between the first fin member and the first barrier layer, wherein the first barrier layer comprises a first barrier portion and a second barrier portion, wherein the second barrier portion is positioned between the first barrier portion and the substrate;

before the heat treatment, removing the first barrier portion, wherein the second barrier portion remains on the first-type dopant member;

during the heat treatment, using the second barrier portion to block a second portion of the first-type dopants at a second side of the first-type dopant member;

providing a second-type dopant layer on the first fin member and on a second fin member, wherein the semiconductor structure comprises the second fin member, wherein the first-type dopant layer and the first barrier layer are positioned between the first fin member and the second-type dopant layer, wherein the second-type dopant layer directly contacts each of the first barrier layer and the second fin member, wherein the second fin member comprises a second semiconductor portion, wherein the second-type dopant layer comprises a first dopant-layer part and a second dopant layer part and is at least one of liquid and amorphous, wherein the second dopant-layer part is positioned between the first dopant-layer part and the substrate;

removing the first dopant-layer part in a process of removing the first dopant-layer portion, wherein the second dopant-layer part remains as a second-type dopant member and directly contacts the second semiconductor portion; and using the heat treatment to enable a first portion of the second-type dopants to diffuse through a first side of the second-type dopant member into the second semiconductor portion.

13. The method of claim 12 comprising:
treating a surface of the first fin member to increase hydrophilicity of the surface of the first fin member;
providing a solution that comprises polar molecules related to the first-type dopants; and
evaporating the solution to enable a portion of the solution to adhere to the first fin member to form the first-type dopant layer.

14. The method of claim 12, wherein the first type dopant member is at least one of liquid and amorphous.

15. The method of claim 12 comprising:
providing a second barrier layer on the first fin member and the second fin member, wherein the second barrier layer directly contacts the second-type dopant layer, wherein the second barrier layer comprises a first barrier part and a second barrier part, wherein the second barrier part is positioned between the first barrier part and the substrate;
removing the first barrier part in a process of removing the first barrier portion, wherein the second barrier part remains on the second-type dopant member; and
during the heat treatment, using the second barrier part to block a second portion of the second-type dopants at a second side of the second-type dopant member.

16. The method of claim 12, wherein the first dopant-layer portion directly contacts at least three sides of the second semiconductor portion.

* * * * *